US007402794B2

(12) United States Patent
Kim et al.

(10) Patent No.: US 7,402,794 B2
(45) Date of Patent: Jul. 22, 2008

(54) RADIOMETER IMAGING SYSTEM AND METHOD THEREOF

(75) Inventors: Yong Hoon Kim, Kwangju (KR); Gm Sil Kang, Jeju-do (KR); Sung Hyun Kim, Kwangju (KR); Jun Ho Choi, Gyeongsangnam-do (KR)

(73) Assignee: Kwangju Institute of Science and Technology (KR)

( * ) Notice: Subject to any disclaimer, the term of this patent is extended or adjusted under 35 U.S.C. 154(b) by 316 days.

(21) Appl. No.: 11/176,242

(22) Filed: Jul. 8, 2005

(65) Prior Publication Data

US 2007/0018089 A1 Jan. 25, 2007

(30) Foreign Application Priority Data

Jul. 8, 2004 (KR) ...................... 10-2004-0052878

(51) Int. Cl.
*G01R 23/02* (2006.01)

(52) U.S. Cl. .................... 250/250; 324/76.14; 342/351; 342/362

(58) Field of Classification Search ................. 250/250; 342/362, 351, 424, 425
See application file for complete search history.

(56) References Cited

U.S. PATENT DOCUMENTS 6,057,799 A 5/2000 Martin-Neira et al.
6,307,502 B1 10/2001 Marti-Canales et al.
6,529,158 B2 * 3/2003 Martin-Neira et al. ...... 342/351
2002/0063657 A1 5/2002 Paul Shuch

OTHER PUBLICATIONS

Gumsil Kang, Sunghyun Kim, Junho Choi and Yonghoon Kim, "Experimental Results of Sub-Y-Type Array for High Angular Resolution Interferometric Radiometer at 37 GHz", The 24th Asian Conference on Remote Sensing & 2003 International Symposium on Remote Sensing (ACRS 2003 ISRS), vol. 2, pp. 1398-1400, Nov. 3-7, 2003.

Gum-Sil Kang, Jiang Jingshan and Yong-Hoon Kim, "Sub-Y-Type Antenna Array Configuration for High Resolution. Interferometric Synthetic Aperture Radiometer", Proceedings of International Symposium on Remote Sensing 2002, pp. 581-586, Oct. 30-Nov. 1, 2002.

(Continued)

*Primary Examiner*—David P. Porta
*Assistant Examiner*—Djura Malevic
(74) *Attorney, Agent, or Firm*—Bacon & Thomas, PLLC

(57) ABSTRACT

A radiometer imaging system includes an antenna array having a plurality of sub-arrays, each being formed of a plurality of antenna elements arranged in a sub-Y-type, a receiver array having the same number of receivers as the antenna elements, each receiver being associated with one of the antenna elements in a one-to-one correspondence to thereby define a channel to generate a first signal and a second signal from an output of each antenna element, and a correlation processor for calculating a correlation for each correlated channel pair, by using the first signal and the second signal for each antenna element, to thereby obtain an 3-D image for the object.

14 Claims, 11 Drawing Sheets

OTHER PUBLICATIONS

Yong-Hoon Kim and Gum-Sil Gang, "Temperature Sensitivity of Sub-Y Type Antenna Array for High Angular Resolution Interferometric Radiometer System", International Union of Radio Science, Aug. 2002.

Gum-Sil Kang and Yong-Hoon Kim, "Spatial and Temperature Resolution of Sub-Y Type Antenna Array Configuration for High Resolution Interferometric Synthetic Aperture Radiometer", 2002 IEEE International Geoscience and Remote Sensing Symposium, pp. 844-846, Jun. 23-27, 2002.

Yong-Hoon Kim and Gum-Sil Kang, "Sub-Y Type Antenna Array Configuration for High-Angular Resolution on Application of an Interferometric Synthetic Aperture Radiometer", Specialist Meeting on Microwave Remote Sensing, pp. 7-8, Nov. 5-9, 2001.

Yong-Hoon Kim, Jung-Hee Choi and Gum-Sil Kang. "Interferometric Synthetic Aperture Millimeter-wave Radiometer for the High Resolution Imaging", Proceedings of International Symposium on Remote Sensing, pp. 122-126, Nov. 3-5, 1999.

Peter J. Napier and A. Richard Thompson, "The Very Large Array: Design and Performance of a Modern Synthesis Radio Telescope", Proceeding of the IEEE, vol. 71, No. 11, pp. 1295-1320, Nov. 1, 1983.

* cited by examiner

RADIOMETER IMAGING SYSTEM AND METHOD THEREOF

FIELD OF THE INVENTION

The present invention relates to a radiometer imaging system and method thereof capable of reducing the number of antenna elements arranged therein while improving a resolution of an image considerably.

BACKGROUND OF THE INVENTION

Interferometric synthetic aperture radiometers have been developed to obtain a high angular resolution using a static array of small antennas, avoiding the scanning of the large size antenna required by real aperture radiometer. An imaging system using a synthetic aperture radiometer reconstructs an image by receiving a radiant energy naturally emitted from an object on the ground in a micrometer-wave or a millimeter-wave band via an antenna array. In this radiometer imaging system, the structure of the antenna array is an important fact that determines acquisition efficiency for image. In general, the antenna array employed in the radiometer imaging system has a pattern in which an overall arrangement is in a Y-type, a Δ-type or a T-type. Among a variety of antenna array patterns, it is well known that the Y-type antenna array is capable of obtaining a narrow width of synthetic aperture beamwidth and a wide range of alias free FOV (Field Of View)

In a conventional Y-type antenna array, however, a number of antenna elements are required to obtain a high resolution image. For example, 130 or more antenna elements are needed to obtain a synthetic aperture beamwidth of about 1°. However, with the increase of the antenna elements, the structure of an overall antenna array becomes complicated, and an operation calculation for obtaining correlations between signals received from each pairs of the antenna elements becomes difficult, which results in an increase of power consumption and a demand for a large-scale system.

Further, in the high resolution imaging system, spatial frequency sampling is performed using the relative distance difference between antenna elements. However, visibility functions in visibility coverage are not sampled in a spatial frequency domain to introduce the alias effect, which is one of the factors deteriorating the image quality recovered by the imaging system.

SUMMARY OF THE INVENTION

It is, therefore, an object of the present invention to provide a radiometer imaging system and method, capable of reducing the number of antenna elements employed therein while improving a resolution of an image.

It is another object of the present invention to provide a radiometer imaging system and method capable of reducing an alias effect.

In accordance with one aspect of the invention, there is provided a radiometer imaging system comprising an antenna array including a number of sub-arrays arranged to form a Y-type configuration, wherein each sub-array is formed of a plurality of antenna elements arranged in a predetermined pattern, each antenna element being responsive to a radiant wave corresponding to a radiant energy emitted from an object; and imaging means for requisiting an image of the object using a signal received from each antenna element in the antenna array.

In accordance with another aspect of the invention, there is provided an method of requisiting an image in a radiometer imaging system including an antenna array and a receiver array, wherein the antenna array including a number of sub-arrays arranged to form a Y-type configuration, each sub-array being formed of a plurality of antenna elements arranged in a sub-Y-type, each antenna element being responsive to a radiant wave corresponding to a radiant energy emitted from an object, the receiver array having the same number of receivers as the antenna elements, each receiver being associated with one of the antenna elements in a one-to-one correspondence to thereby define a channel, for generating a first signal having a predetermined band extracted from an output of each antenna element and a second signal having a phase difference of 90 degrees from the first signal, the method comprising the steps of: (a) calculating a pixel map coordinate by using position information of the antenna elements in the antenna array; (b) measuring correlations for channel pairs; (c) mapping the correlations correspondingly to the pixel map coordinate, to thereby produce 2-D (two-dimensional) pixel data for the object; (d) performing a 1-D FFT (Fast Fourier Transformation) on values extracted along a first direction of the pixel map coordinate with respect to the first 2-D pixel data, to thereby obtain a first 1-D (one-dimensional) profile; (e) performing a 1-D FFT on values on a first main-axis among the first 2-D pixel data, to thereby obtain a first 1-D main-axis component profile which does not affected by an alias effect, where 0 represents a principal axis indicating a coordinate axis in which no alias component is generated;

(f) generating a corrected 1-D profile in which alias components are removed with respect to the first direction of the pixel map coordinate by using the first 1-D profile and the first 1-D FFT main-axis component profile; (g) performing an inverse FFT (IFFT) on the first corrected 1-D FFT profile, to thereby recover a first corrected pixel signal; (h) performing a 1-D FFT on the values extracted along a second direction of the pixel map coordinate perpendicular to the first direction, to thereby generate a second 1-D profile; (i) performing a 1-D FFT performed on values along the second main-axis among the first corrected pixel signal, to thereby obtain a second 1-D main-axis component profile, wherein the second main-axis is defined as a diagonal axis with respect to the first main-axis; (j) removing alias components by using the second 1-D profile and the second 1-D main-axis component profile, to thereby produce a second 1-D corrected profile; (k) performing an inverse FFT on the second corrected FFT profile, to thereby obtain a second corrected image signal; and (k) performing a 2-D FFT on the second corrected image signal, to thereby obtain a 2-D image for the object.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, a preferred embodiment of the present invention will be described in detail with reference to the accompanying drawings.

Figure 1:
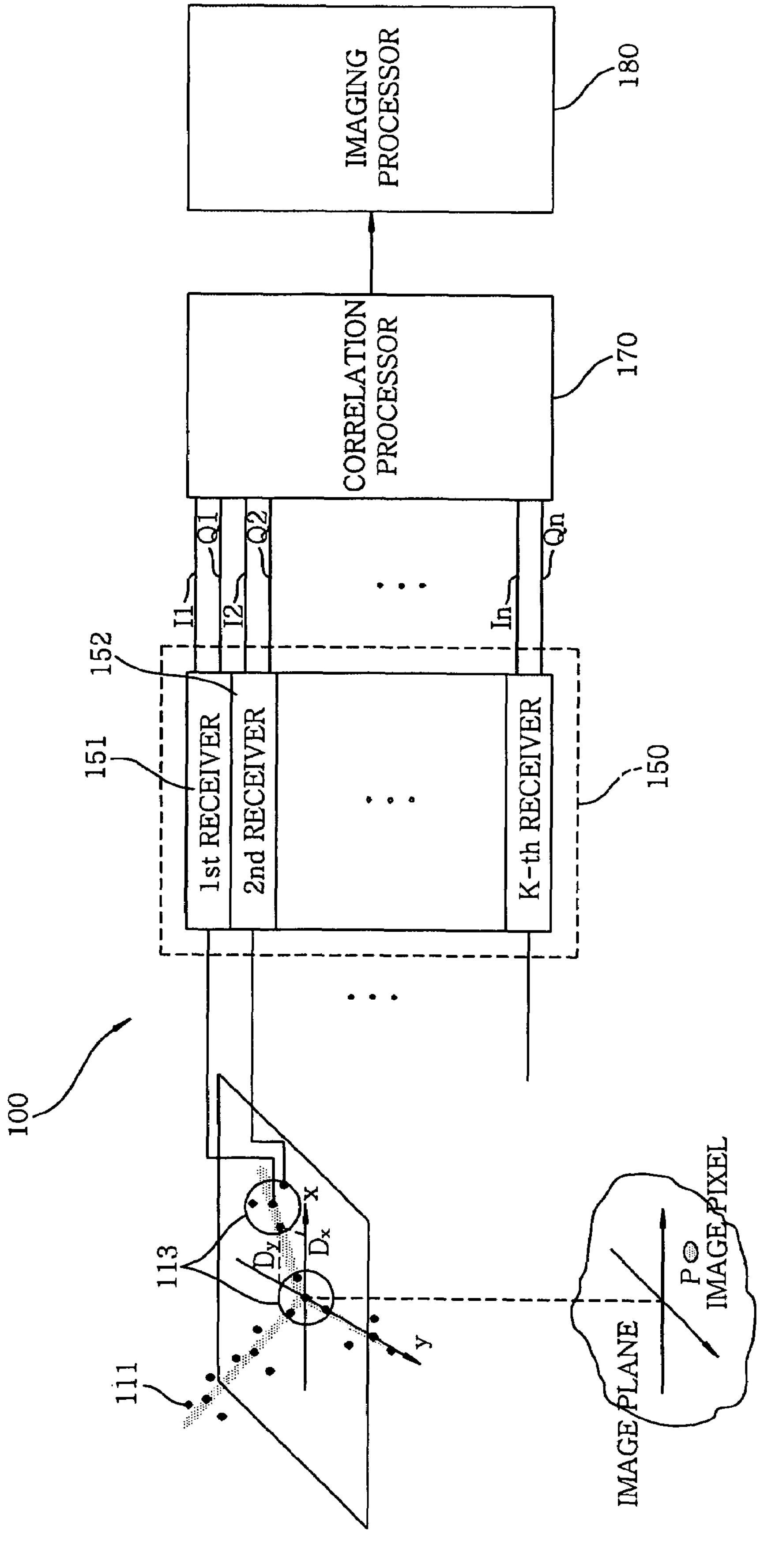
FIG. 1 is a block diagram of a radiometer imaging system in accordance with a preferred embodiment of the present invention.
Figure 2:
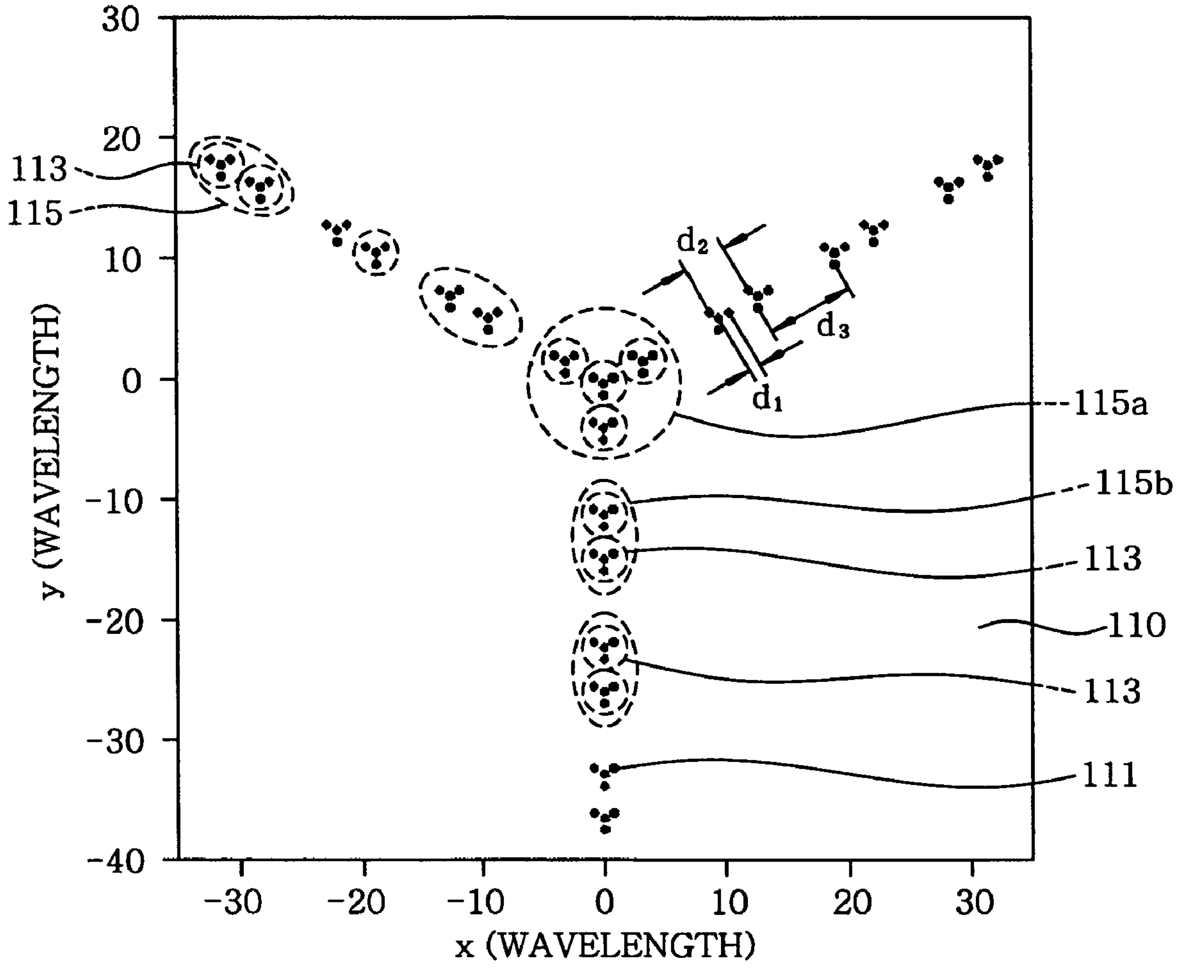
FIG. 2 provides a detailed diagram of the antenna array shown in FIG. 1.

FIG. 1 is a block diagram of a radiometer imaging system 100 in accordance with the present invention, and FIG. 2 shows a detailed diagram of the antenna array shown in FIG. 1.

As shown in FIG. 1, the radiometer imaging system 100 includes an antenna array 110, a receiver array 150, a correlation processor 170 and an imaging processor 180. The antenna array 110 has a number of antenna elements 111. Each of the antenna elements 111 may be formed of a known antenna type, for example, microsrtip antenna and waveguide antenna, which is capable of receiving a millimeter- or a micrometer-wave band signal. The antenna elements 111 transmit the received signals to the receiver array 150.

The receiver array 150 has the same number of receivers 151 as that of the antenna elements, each corresponding to one of the antenna elements 111 in a one-to-one correspondence, to thereby define a channel between an antenna element and a receiver.

As for the antenna array 110, a plurality of antenna elements 111 forms a single sub-array 113, and a multiplicity of sub-arrays 113 are arranged in a radial direction about their central position while maintaining a predetermined angular interval therebetween, thus forming a Y-type configuration. Preferably, the sub-arrays 113 are radially disposed with respect to the central position by an angular interval of 120 degrees. Such antenna array 110 can be formed by arranging the antenna elements 111 on an object on which an antenna is to be installed or on a base substrate in the above-described Y-type pattern.

Figure 3:
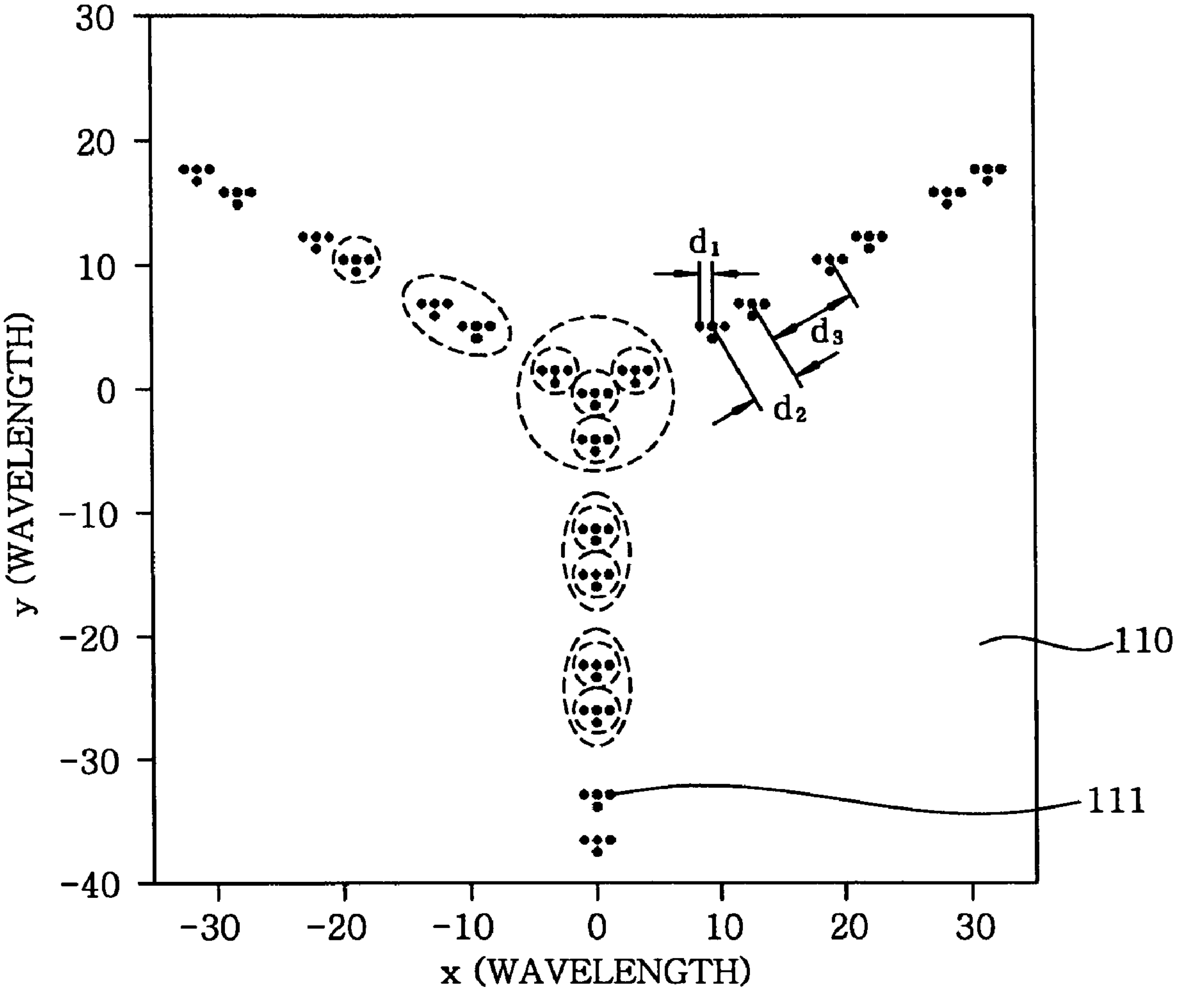
FIGS. 3 to 5 show various modifications of the antenna array shown in FIG. 2.
Figure 4:
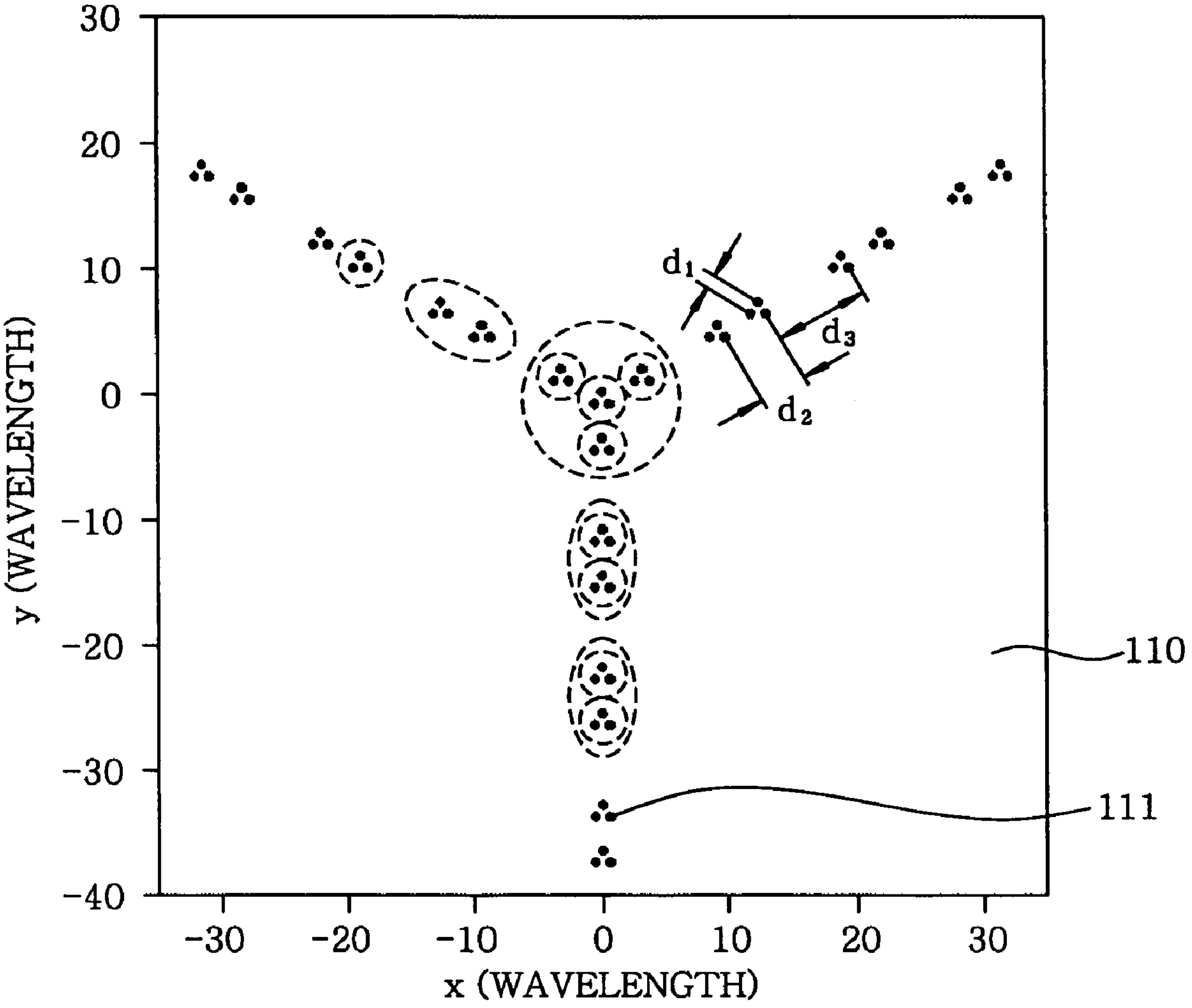

As best shown in FIG. 2, the antenna array 110 includes a multiplicity of sub-arrays 113, each being formed of a plurality of, e.g., four antenna elements 111 arranged in a Y-type configuration. Hereinafter, the Y-type configuration formed by a plurality of antenna elements within each sub-array will be referred to as a sub-Y-type as contrast as the Y-type pattern formed by a multiplicity of the sub-arrays. Further, several sub-arrays 113 joint to form a single sub-array group, and thus formed sub-array groups are categorized into a central sub-array group 115*a* disposed at a central portion of the antenna array 110 and a plurality of branch sub-array groups 115*b* disposed in the Y-type pattern of the same angular interval of 120 degrees about the central sub-array group 115*a*. The central sub-array group 115*a* has four sub-arrays 113 while each branch sub-array group 115*b* has two sub-arrays 113. The grouping of the sub-arrays is intended to extend the arm of sub-Y-type array keeping a complete sampling on a principle axes. The pattern in which the antenna elements 111 are arranged in each sub-array 113 may have a shape other than the Y-shape shown in FIG. 2. For example, as can be seen from FIGS. 3 to 5, each sub-array 113 can have a T-type, a Δ (delta)-type or a linear pattern, respectively and a number of sub-arrays 113 are radially arranged about a central position by an angular interval of 120 degrees, to thereby form a Y-shape as a whole in each of the drawings. Here, each sub-array 113 illustrated in FIGS. 4 and 5 are formed of three antenna elements other than that of FIG. 3.

Figure 5:
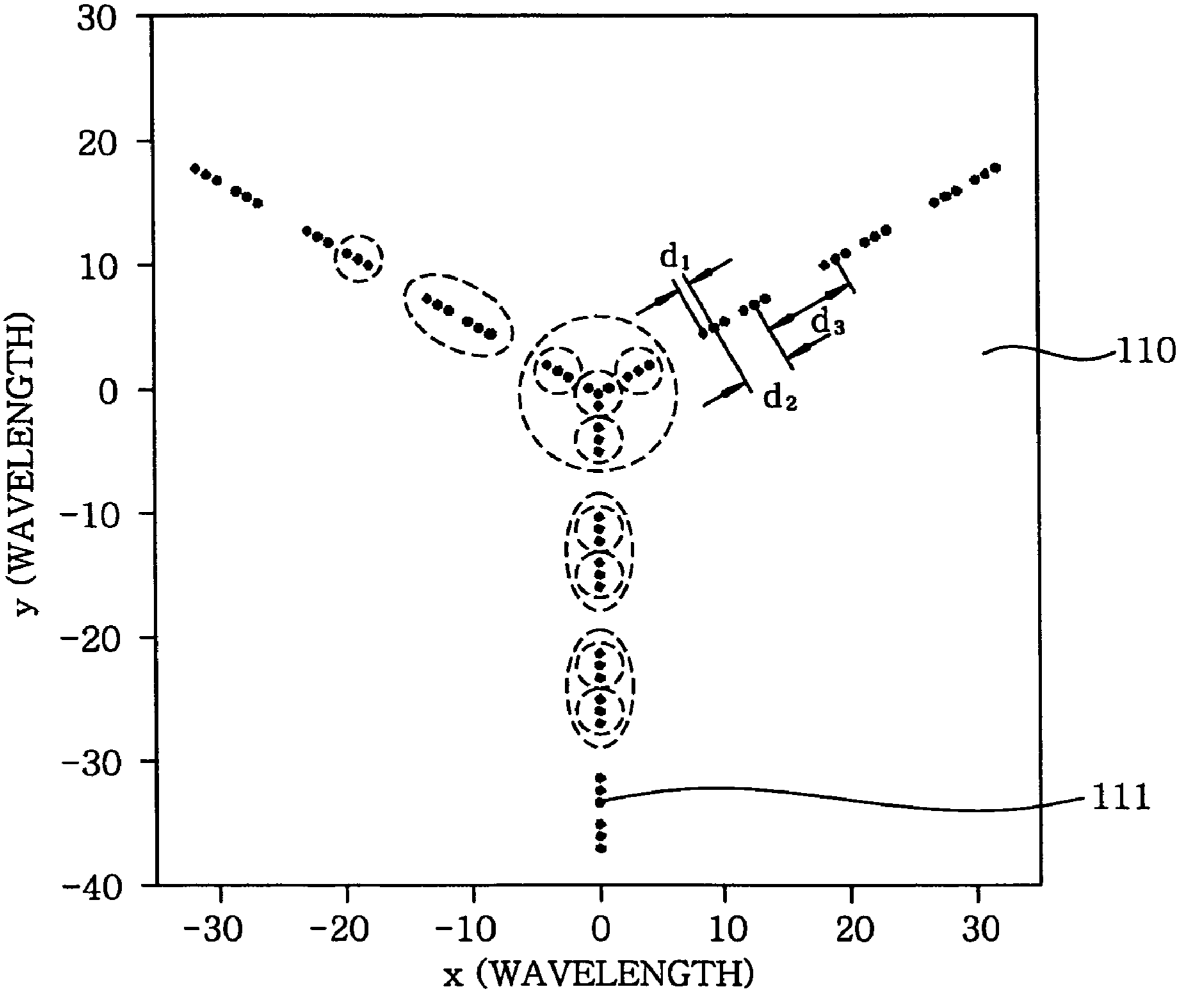

In FIGS. 2 and 5, reference numeral d1 represents an interval between antenna elements 111, reference numeral d2 represents an interval between the sub-arrays 113, and reference numeral d3 represents an interval between the sub-array groups 115*a* and 115*b*. The interval d1 between unit antennas 111 in a single sub-array 113 is determined depending on a desired alias free FOV. Preferably, the interval d1 is set to be shorter than a central wavelength λ but not smaller than 0.5 times the central wavelength λ (that is, $0.5\lambda<d1<\lambda$).

The interval d2 between the sub-arrays 113 and the interval d3 between the sub-array groups 115 are determined to be $4d1<d2<8d1$ by considering a desired synthetic aperture beamwidth and a principal beam efficiency.

Figure 6:
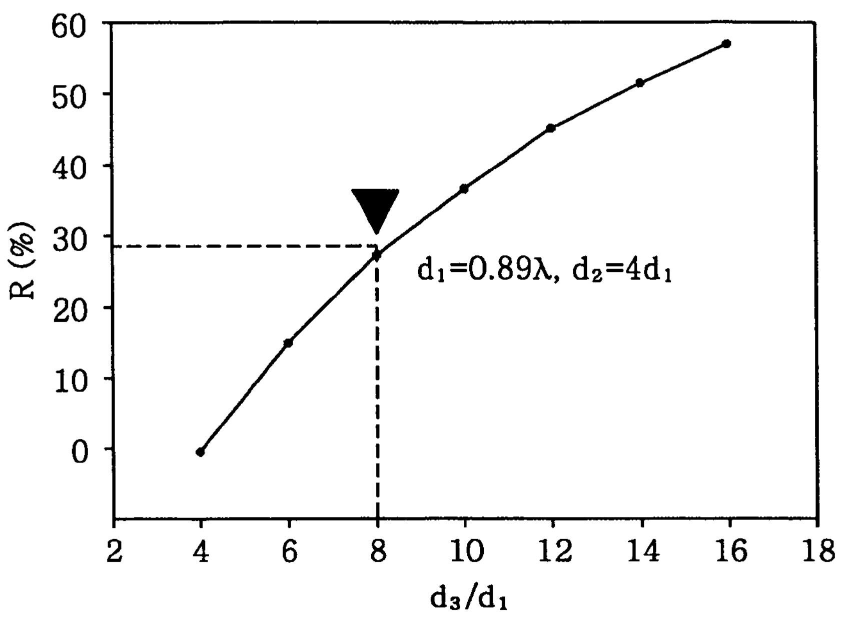
FIG. 6 presents a graph simulating a a reduction rate of a beamwidth with the increase of an interval between sub-array groups in the antenna array shown in FIG. 2.

For example, FIG. 6 provides a simulation result of a reduction rate R of an antenna beamwidth in the antenna array 110 shown in FIG. 2 when the interval d3 is varied while setting $d1=0.89\lambda$ and $d2=4d1$. As can be seen from FIG. 6, the reduction rate R of the beamwidth is varied depending on the interval d3. Accordingly, the interval d3 needs to be determined based on a desired reduction rate R of the beamwidth.

Figure 7:
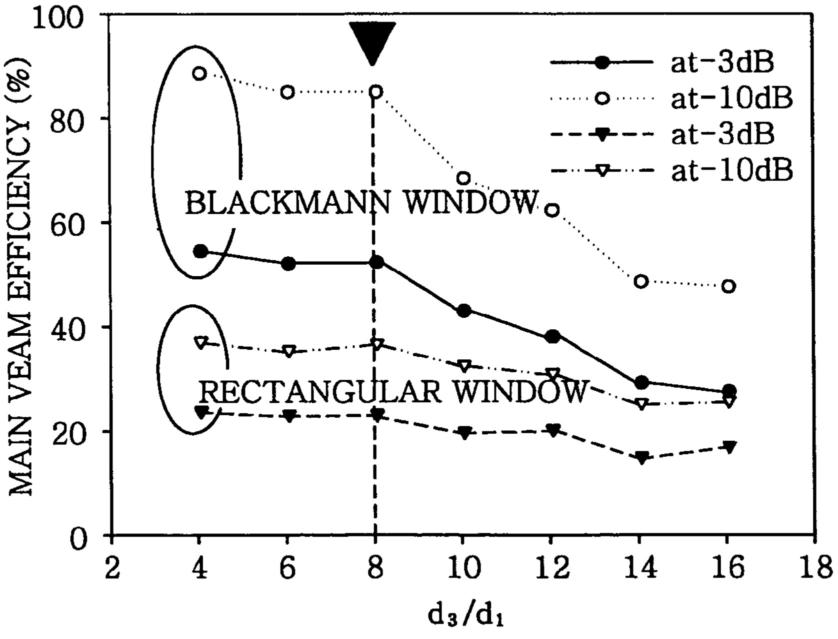
FIG. 7 depicts a simulated graph for principal beam efficiency with the increase of an interval between sub-array groups in the antenna array shown in FIG. 2.

Further, as shown in FIG. 7, the principal beam efficiency can also be varied depending on the interval d3 between the sub-array groups 115*a* and 115*b*. That is to say, the principal beam efficiency decreases sharply when the interval d3 becomes greater than eight times the interval d1. Therefore, it is preferred to set the interval d3 to be not greater than eight (~twenty) times the interval d1 (i.e., $d3\leqq 8d1$ (~20d1)). Here, the principal beam efficiency refers to a ratio of energy by a principal beam to an entire energy that arrives at an antenna. The principal beam represents a beam of a direction in which a maximum energy is emitted from the antenna.

Meanwhile, the receiver array 150 includes a first to an k-th (where 'k' represents a positive integer) receivers, each being connected to one of the antenna elements 111 in a one-to-one on a corresponding channel. In FIG. 1, there is illustrated that only two receivers have reference numerals 151 and 152 assigned thereto for the sake of simplicity of drawings and explanation of the invention.

All of the receivers 151, 152, . . . have same components, and each serves to extract a signal having a predetermined band from the output provided from a corresponding one of the antenna elements 111 to generate a first signal I and a second signal Q. The first signal I is an in phase signal while the second signal Q is a quadrature phase signal which is phase-delayed by 90 degrees from the first signal I.

Figure 8:
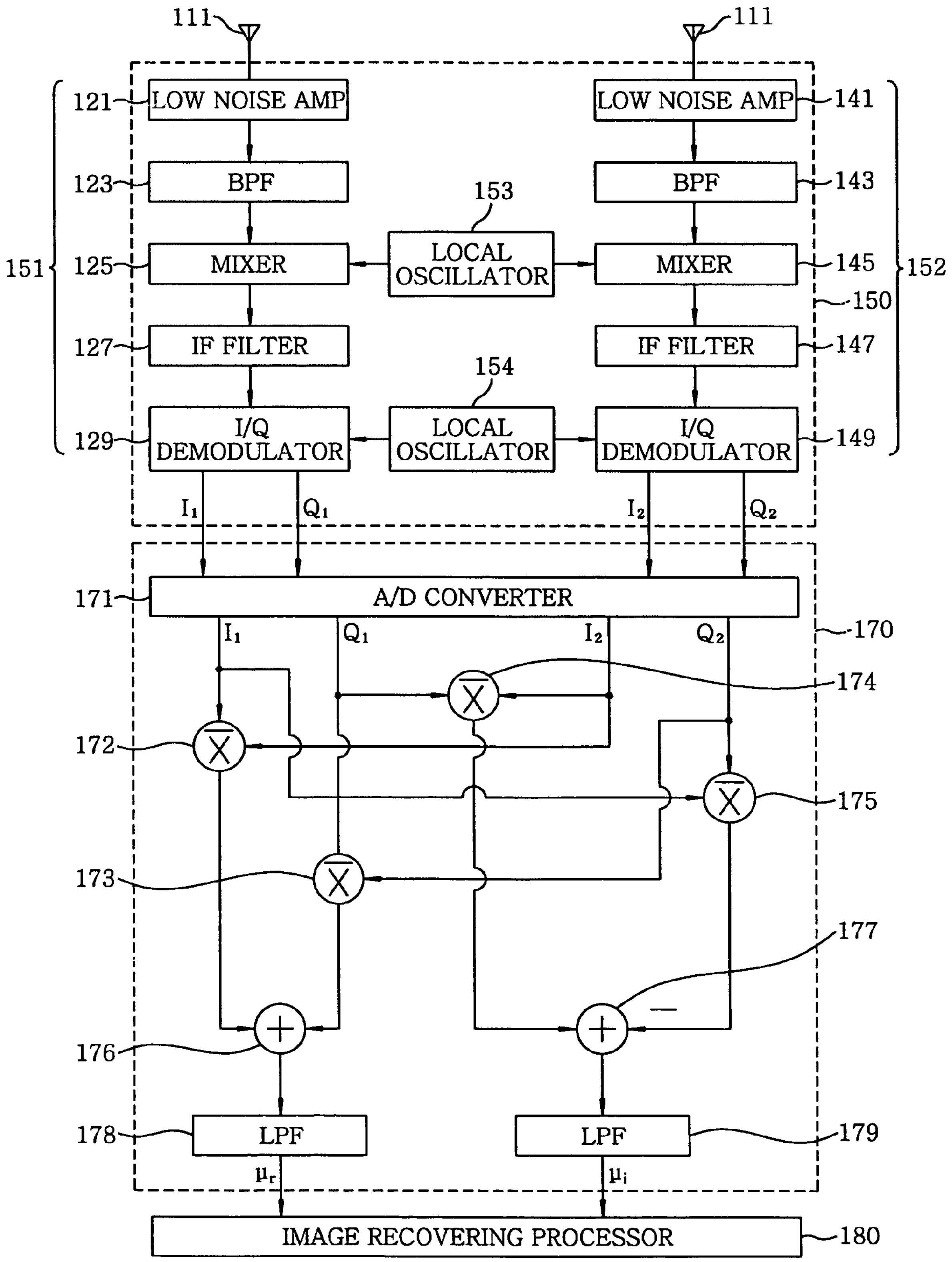
FIG. 8 shows examples of the receiver array and the correlation processor shown in FIG. 1, wherein two receivers are shown therein for the simplicity of the drawing.

FIG. 8 shows detailed block diagram of the receiver array 150 and the correlation processor 170 shown in FIG. 1, wherein the drawing describes a correlation process with the two receivers 151 and 152 in order to help the understanding of the correlation calculation mechanism while avoiding complexity of the drawing.

As shown in FIG. 8, the receivers 151 and 152 include low-noise amplifiers 121 and 141; bandpass filters 123 and 143; mixers 125 and 145; IF (Intermediate Frequency) filters 127 and 147; I/Q demodulators 129 and 149; and local oscillators 131 and 133, respectively. As for the local oscillators 131 and 133, the two receivers 151 and 152 share them. Alternatively, it is possible for each receiver to have separate local oscillators.

The low-noise amplifiers 121 and 141 amplify by a predetermined gain the signals received from their respective corresponding antenna elements 111, respectively. The bandpass filters 123 and 143 allow only signals having a predetermined band to pass therethrough among the amplified signals from the low-noise amplifiers 121 and 141, respectively. The mixers 125 and 145 mix the signals from the bandpass filters 123 and 143 with signals oscillated by the local oscillators 153 and 154 to down-convert the mixed signals into signals with a predetermined frequency band, respectively. The IF filters 127 and 147 allow only the down-converted signals with predetermined intermediate frequency band from the mixers 125 and 145 to pass therethrough, respectively. The I/Q demodulators 129 and 149 demodulates the outputs from the IF filters 127 and 147 to produce first signals $I_1$, $I_2$ and second signals $Q_1$, $Q_2$, respectively. The first signals $I_1$, $I_2$ are in phase signals while the second signals $Q_1$, $Q_2$ have a phase difference of 90 degrees from the first signals $I_1$, $I_2$, respectively.

The correlation processor 170 calculates correlation (Sn, m) between two correlated channels m and n (n≠m) by using the first signals $I_1$, $I_2$ and the second signals $Q_1$, $Q_2$ outputted from the two correlated channel pairs. Here, n and m represent channel numbers for the receivers in the receiver array 150, respectively.

The correlation is obtained for each pair of two correlated receivers by using the following equation.

$$Sn,m=E[I_n\times I_m]+E[Q_n\times Q_m]+j\{E[Q_n\times I_m]-E[I_n\times Q_m]\} \quad \text{Eq. 1}$$

Here, E[.] represents a mean value; m an n denote correlated channel pairs; $I_n$ and $I_m$ indicate first signals from correlated channel pairs, respectively; $Q_n$ and $Q_m$ indicate second signals from correlated channel pair, respectively; and j represents an imaginary number portion of a complex number.

Thus, for example, the correlation for a pair of the first and the second receivers 151 and 152 is calculated as follows:

$$S1,2=E[I_1\times I_2]+E[Q_1\times Q_2]+j\{E[Q_1\times I_2]-E[I_1\times Q_2]\}.$$

The correlation processor 170 calculates correlations for all of correlated receiver pairs. Such a correlation processor 170 includes an A/D converter 171, first to fourth multiplication average calculators 172 to 175, first and second adders 176 and 177, and low pass filters (LPFs) 178 and 179.

The A/D converter 171 converts the first signals $I_1$, $I_2$ and the second signals $Q_1$, $Q_2$ from the receivers 151 and 152 into digital signals.

The first multiplication average calculator 172 multiplies a first signal $I_1$ from the first receiver 151 and a first signal $I_2$ from the second receiver 152 and then calculates a mean value thereof, $E[I_1\times I_2]$. The second multiplication average calculator 173 multiplies a second signal $Q_1$ from the first receiver 151 and a second signal $Q_2$ from the second receiver 152 and then calculates a mean value thereof, $E[Q_1\times Q_2]$. The third multiplication average calculator 174 multiplies the first signal $Q_1$ from the first receiver 151 and the second signal $I_2$ from the second receiver 152 and then calculates a mean value thereof, $E[Q_1\times I_2]$. The fourth multiplication average calculator 175 multiplies the first signal $I_1$ from the first receiver 151 and the second signal $Q_2$ of the second receiver 152 and then calculates a mean value thereof, $E[I_1\times Q_2]$. The first adder 176 adds the outputs from the first and the second multiplication average calculators 172 and 173 to produce an added signal $\mu_r$. The added signal $\mu_r$ from the first adder 176 indicates the real number portion of the correlation (Sn,m), namely, $E[I_n\times I_m]+E[Q_n\times Q_m]$. The second adder 177 subtracts the output of the fourth multiplication average calculator 175 from the output of the third multiplication average calculator 174 to produce a subtracted signal $\mu_i$. The signal $\mu_i$ produced by the second adder 177 indicates an imaginary number portion of the correlation (Sn,m), namely, $j\{E[Q_1\times I_2]-E[I_1\times Q_2]\}$.

The low pass filters 178 and 179 serve to pass only the signals of low frequency band among the signals from the first and the second adders 178 and 179.

Figure 9:
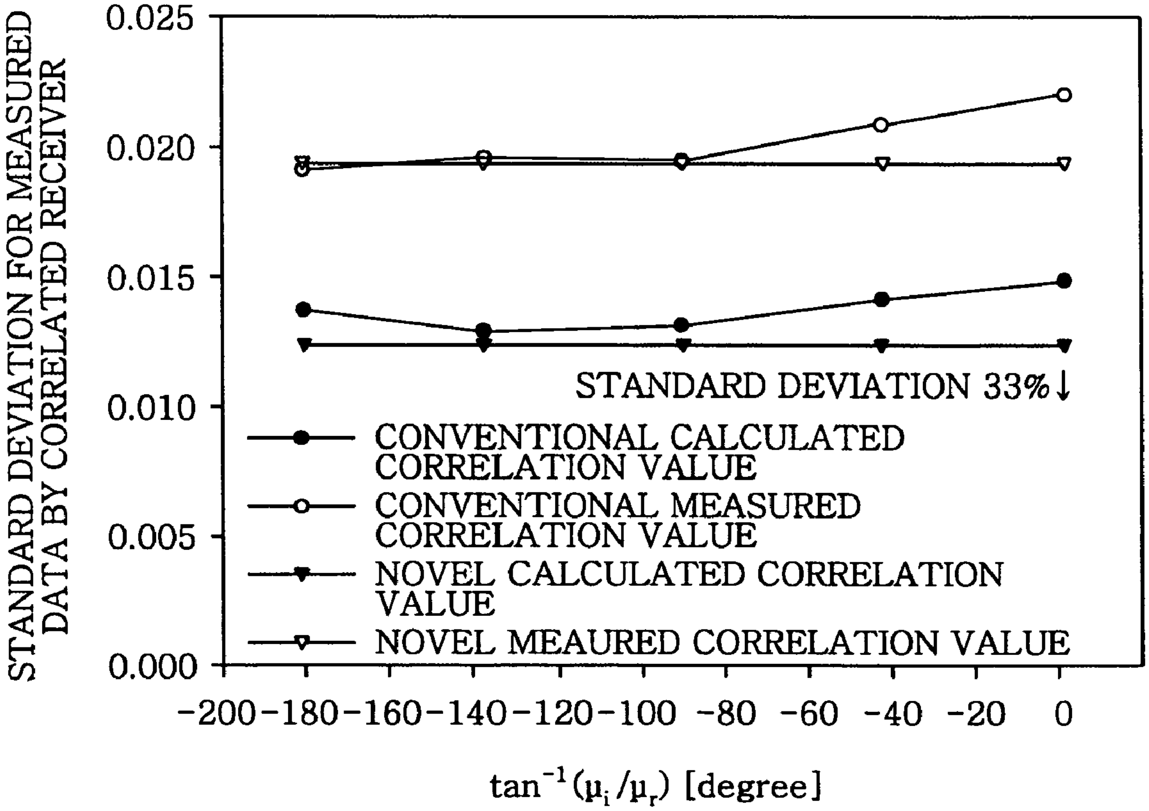
FIG. 9 offers a graph describing a standard deviation of each of a conventional correlation calculation method and an inventive correlation calculation method.
Figure 10:
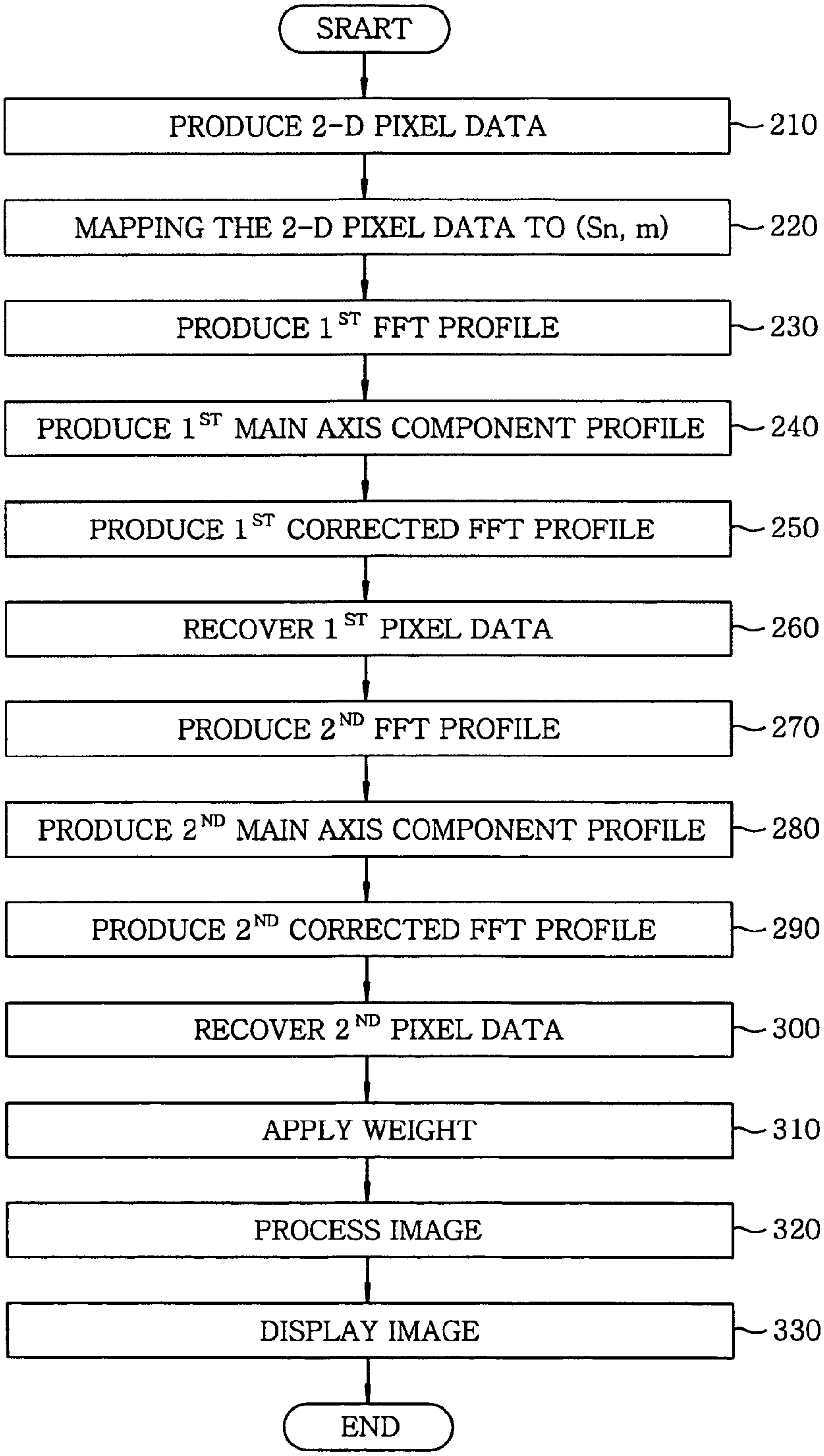
FIG. 10 provides a flow chart describing an imaging process in accordance with a preferred embodiment of the present invention.

The imaging processor 180 generates a 2D image by using the correlations of channel pairs provided from the correlation processor 170. In order to investigate the efficiency of the inventive correlation calculation method performed by the correlation processor 170, this method was compared with a conventional correlation calculation method whose correlations are calculated as follows: $S^*n,m=E[I_n\times I_n]+j\{E[Q_n\times I_m]\}$, and the comparison result is shown in FIG. 9. It is observed from the comparison result that the value of a standard deviation is reduced, and thus a temperature resolution characteristic increased about 30% to 42%.

An image reconstructing process performed by the imaging processor 180 shown in FIG. 8 will be further described with reference to FIGS. 10 to 14.

First, at step 210, pixel map (visibility coverage) coordinates are obtained by using position information of the antenna elements 111 by the correlation processor 170 in the antenna array 110, to thereby detect 2-D pixel data which will then be stored, wherein the pixel map coordinates reflect the correlations of antenna element pairs.

Here, the pixel map coordinates are obtained by using the following equation:

$$u=(X_m-X_n)/\lambda,\ v=(Y_m-Y_n)/\lambda \quad \text{Eq. 2}$$

wherein u and v are axes of spatial frequency domain, respectively; λ represents a central wavelength; $X_m$ and $Y_m$ are X and Y coordinates of an antenna element 111 for a channel m, while $X_n$ and $Y_n$ represent X and Y coordinates of an antenna element 111 for a channel n.

Figure 11:
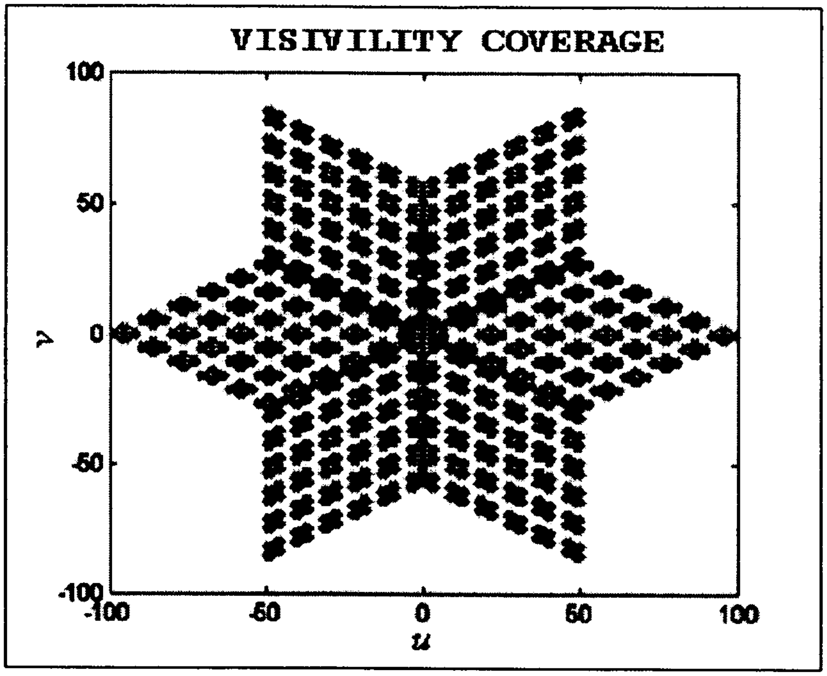
FIG. 11 is a graph showing a pixel map (visibility coverage) obtained by using the antenna array in FIG. 2.

For example, FIG. 11 shows pixel map coordinates obtained with respect to the antenna elements 111 in the antenna array 110 shown in FIG. 2.

Then, at step 220, the 2-D pixel data are correspondingly mapped to the correlations (Sn,m) for the channel pairs (m, n) measured by the correlation processor 170.

Then, at step 230, in order to examine an influence caused by the alias effect, a 1-D FFT (Fast Fourier Transformation) is performed on the 2-D pixel data using values extracted along a first direction of the pixel map coordinates, to thereby recover a first 1-D profile $\hat{P}$ for each value. In this regard, the first direction of the pixel map coordinate is any one of a u-direction and a v-direction which are perpendicular to with each other. In the following description, the u-direction is defined as a first pixel map coordinate direction in spatial frequency domain while the v-direction is defined as a second pixel map coordinate direction in spatial frequency domain.

Figure 12:
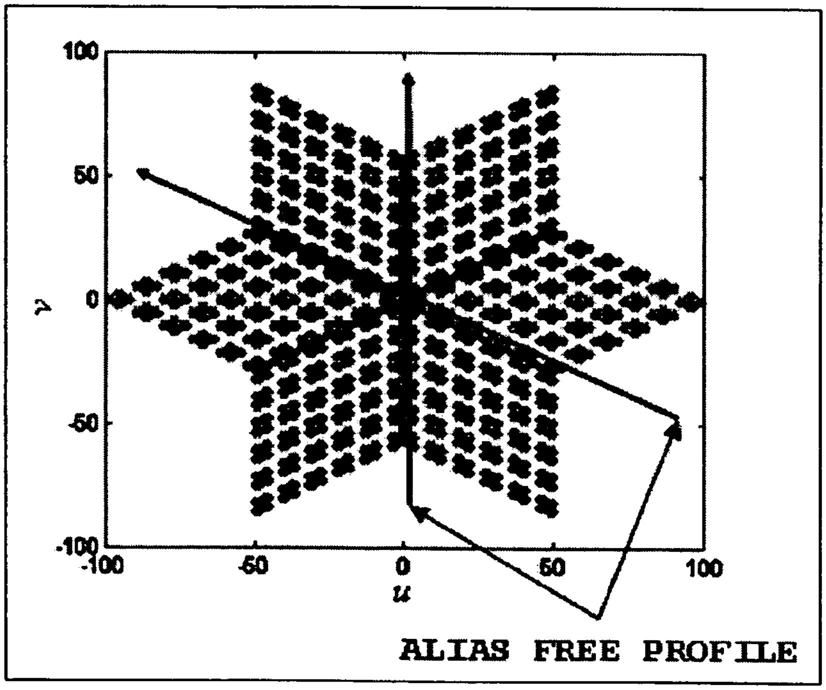
FIG. 12 presents a graph showing principal axes of the pixel map shown in FIG. 11.

At step 240, in order to remove an alias effect, a 1-D FFT is also performed on the first 1-D profiles $\hat{P}$ using values on a first main-axis, to thereby obtain first 1-D main-axis component profiles $\hat{P}_0$ which are not influenced by the Alias effect among the first 1-D profiles $\hat{P}$, where zero('0') represents a main-axis. Herein, the main-axis refers to a coordinate axis in which no alias component is generated, and, in FIG. 12, is marked as a term 'alias free profile'. In the Y-type configuration of the antenna array 110, a main-axis refers to each branch direction serving as a center axis with respect to remaining axes. In this preferred embodiment, the main-axis is defined as a vertically upright axis among the axes shown in FIG. 12.

And then, at step 250, the first 1-D profiles $\hat{P}$ are corrected using the 1-D main-axis component profiles $\hat{P}_0$, to thereby obtain first corrected 1-D profiles $\overline{P}$ in which alias components are removed with respect to the first direction (u) of the pixel map coordinate in spatial frequency domain.

The 1-D corrected profiles are calculated by the following equation:

$$\overline{P} = \sqrt{\frac{|\hat{P}_0|}{|\hat{P}|}}\,\hat{P} \qquad \text{Eq. 3}$$

where $\hat{P}$ refers to a 1-D profile, $\hat{P}_0$ represents a 1-D main-axis component profile and $\overline{P}$ represents a corrected 1-D profile.

At step 260, the corrected 1-D profiles $\overline{P}$ are subjected to an inverse FFT (IFFT), to thereby recover 2-D pixel data. The 2-D pixel data are first recovered 2-D data to which values corrected to correspond to the pixel map coordinates in FIG. 11 are applied.

Then, the same processes as the above-described steps 230 to 260 are performed using the first recovered 2-D pixel data with respect to a second pixel map coordinate direction v and a second principal axis, to thereby remove alias components in the second pixel map coordinate direction. That is to say, a 1-D FFT is performed on the values extracted along the second pixel map coordinate direction v perpendicular to the first pixel map coordinate direction u with respect to the first recovered 2-D pixel data, to thereby generate a second 1-D profile $\hat{P}$ (at step 270).

And then, at step 280, a 1-D FFT is also performed on the second 1-D profiles $\hat{P}$ using values along the second main-axis, to thereby obtain second 1-D main-axis profiles $\hat{P}_0$, which are not influenced by the alias effect among the second 1-D profiles $\hat{P}$. Here the second main-axis is defined as a diagonal axis with respect to the first main-axis in FIG. 12.

Thereafter, at step 290, the second 1-D profiles $\hat{P}_0$ are corrected using the second 1-D main-axis component profile $\hat{P}_0$ while applying the weighting function as expressed in Eq. 3, to thereby produce second corrected profiles $\overline{P}$ in which alias components are removed with respect to the second direction (v) of the pixel map coordinates in spatial frequency domain.

Subsequently, an inverse FFT (IFFT) is performed on the second corrected profiles $\overline{P}$, to thereby obtain a second recovered pixel data at step 300. As a result, the second corrected pixel data is a 2-D pixel signal obtained by removing alias components in both u and v directions.

Afterwards, at step 310, a weight is applied on the second corrected pixel data without having alias components, to thereby produce a corrected image signal. Such a weighting can be accomplished by using various known methods: for example, by using a rectangular window, a hamming window, a hanning window, a gaussian window, etc. Alternatively, the weighting may be omitted.

Then, a 2-D FFT is performed on the corrected image signal, to thereby obtain a desired 2-D image for the object at step 320, and the 2-D image is displayed on a display element at step 330.

Figure 13:
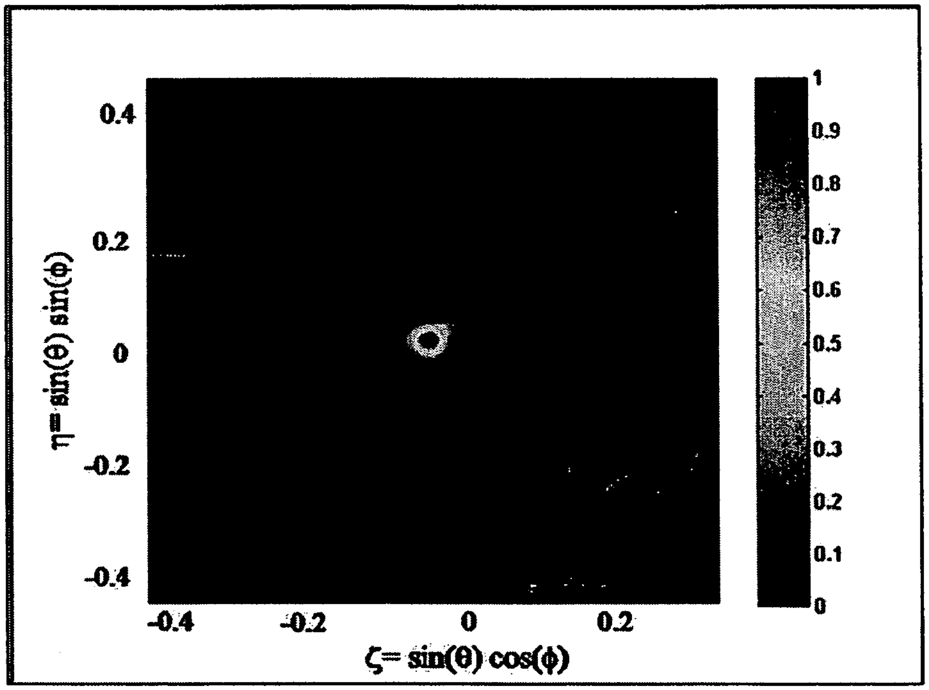
FIG. 13 sets forth a photograph of a pixel image obtained by using the antenna array shown in FIG. 2.
Figure 14:
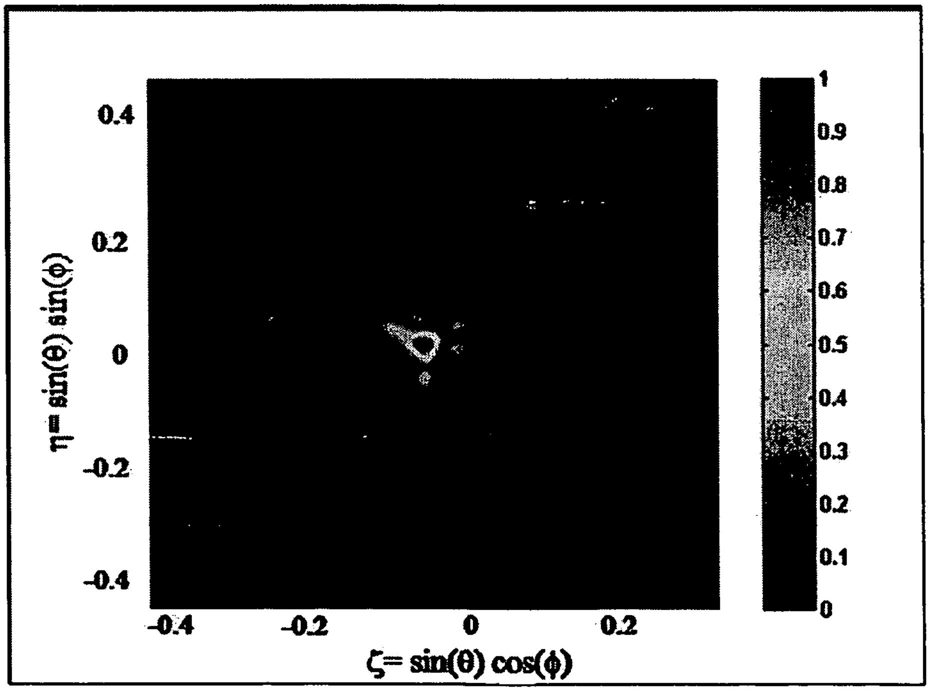
FIG. 14 (PRIOR ART)
FIG. 14 provides a photograph of a pixel image obtained by using a conventional Y-type antenna array.

FIGS. 13 and 14 show experiment results of imaging performance of the novel imaging system and the conventional imaging system, respectively.

FIG. 13 is a unit pixel image obtained by using an antenna array in which 40 antenna elements are arranged in the sub Y-type configuration as shown in FIG. 2, wherein a central frequency, a bandwidth, a measurement distance and a measurement time are set to be 37 GHz, 100 MHz, 4 M and 0.65 μs, respectively. FIG. 14 is a unit pixel image obtained by using an antenna array in which 52 antenna elements are arranged in a conventional Y-type, wherein a central frequency, a bandwidth, a measurement distance and a measurement time are set to be 37 GHz, 100 MHz, 4 M and 0.65 μs, respectively, as in FIG. 13.

As can be seen from the comparison of the unit pixel images in FIGS. 13 and 14, the novel imaging system can generate a unit pixel image of a size identical to that of a unit pixel image obtained by the conventional imaging system even though using 12 less antenna elements. Consequently, with the reduced number of antenna elements, a greatly improved pixel resolution can be obtained in accordance with the present invention.

While the invention has been shown and described with respect to the preferred embodiments, it will be understood by those skilled in the art that various changes and modifications may be made without departing from the spirit and scope of the invention as defined in the following claims.

What is claimed is:

1. A radiometer imaging system comprising:

an antenna array including a plurality of sub-array groups respectively having at least two sub-arrays arranged to form a Y-type configuration, wherein each sub-array is formed of a plurality of antenna elements arranged in a predetermined pattern, each antenna element being responsive to a radiant wave corresponding to a radiant energy emitted from an object; and imaging means for obtaining an image of the object using a signal received from each antenna element in the antenna array.

2. The system of claim 1, wherein the imaging means includes:

a receiver array, having the same number of receivers as the antenna elements, each receiver being associated with one of the antenna elements in a one-to-one correspondence to thereby define a channel, each receiver generating a first signal having a predetermined band extracted from an output of each antenna element and a second signal having a phase difference of 90 degrees from the first signal;

a correlation processor for calculating a correlation for each correlated channel pair, by using the first signal and the second signal for each antenna element; and an imaging processor for obtaining the image of the object using the correlation provided by the correlation processor.

3. The system of claim 2, wherein the correlation is expressed as follows:

$$Sn,m=E[I_n \times I_m]+E[Q_n \times Q_m]+j\{E[Q_n \times I_m]-E[I_n \times Q_m]\}$$

Where E represents a mean value; n and m (n≠m) are correlated channel pairs; $I_n$ and $I_m$ are first signals obtained by the correlated channel pairs; and $Q_n$ and $Q_m$ are second signals obtained by the correlated channel pairs.

4. The system of claim 1, wherein the sub-arrays are arranged in a radial direction about a central position while maintaining a same angular interval therebetween, to thereby form the Y-type configuration.

5. The system of claim 4, wherein the same angular interval is 120 degrees.

6. The system of claim 1, wherein the predetermined pattern in which the antenna elements are arranged in each sub-array is one of a Y-type, a triangular, a T-shaped and a linear pattern.

7. The system of claim 1, wherein an interval d1 between the antenna elements, an interval d2 between the sub-arrays and an interval d3 between the plurality of sub-array groups satisfy a relationship of 0.5λ<d1<λ, 4d1<d2<8d1, 4d1<d3<20d1, wherein λ represents a predetermined central wavelength, and wherein a sub-array group includes several numbers of sub-arrays grouped each other.

8. A method of obtaining an image in a radiometer imaging system including an antenna array and a receiver array, wherein the antenna array includes a plurality of sub-array groups respectively having at least two sub-arrays arranged to form a Y-type configuration, each sub-array is formed of a plurality of antenna elements arranged in a sub-Y-type, each antenna element is responsive to a radiant wave corresponding to a radiant energy emitted from an object, the receiver array has the same number of receivers as the antenna elements, each receiver is associated with one of the antenna elements in a one-to-one correspondence to thereby define a channel, and each receiver generates a first signal having a predetermined band extracted from an output of each antenna element and a second signal having a phase difference of 90 degrees from the first signal, the method comprising the steps of:

(a) calculating a pixel map coordinate by using position information of the antenna elements in the antenna array, to thereby produce 2-D (two-dimensional) pixel data for the object;

(b) measuring correlations for channel pairs;

(c) mapping the correlations correspondingly to the pixel map coordinate;

(d) performing a 1-D FFT (Fast Fourier Transformation) on the first 2-D pixel data by using values extracted along a first direction of the pixel map coordinate, to thereby obtain first 1-D (one-dimensional) profiles;

(e) performing a 1-D FFT on values on the first 1-D profiles using values on a first main-axis, to thereby obtain a first 1-D main-axis component profiles which are not influenced by an alias effect among the first 1-D profiles;

(f) correcting the first 1-D profiles by using the first 1-D main-axis component profile, to produce corrected 1-D profiles in which alias components are removed with respect to the first direction of the pixel map coordinate main-axis;

(g) performing an inverse FFT (IFFT) on the first corrected 1-D profiles, to thereby recover a first 1-D pixel data;

(h) performing a 1-D FFT on the first recovered 1-D pixel data using the values extracted along a second direction of the pixel map coordinate perpendicular to the first direction, to thereby generate second 1-D profiles;

(i) performing a 1-D FFT on the second 1-D profiles using values along the second main-axis, to thereby obtain a second 1-D main-axis component profile, which are not influenced by the alias effect among the first corrected pixel signal, wherein the second main-axis is defined as a diagonal axis with respect to the first main-axis;

(i) correcting the second 1-D main-axis component profile by using the second 1-D profiles main-axis, to thereby produce a second 1-D corrected profile in which alias components are removed in the second direction;

(k) performing an inverse FFT on the second 1-D corrected profiles, to thereby obtain a second corrected 1-D pixel data in which the alias components are removed in both directions u and v; and (l) performing a 2-D FFT on the second corrected pixel data, to thereby obtain a 2-D image for the object.

9. The method of claim 8, wherein the pixel map coordinates are obtained by using the following equation:

$$u=(X_m-X_n)/\lambda,\ v=(Y_m-Y_n)/\lambda$$

where u and v are axes of spatial frequency domain, respectively; λ is a central wavelength; m and n are correlated channel pairs; $X_m$ and $Y_m$ are X and Y coordinates of an antenna element for a channel m, while $X_n$ and $Y_n$ represent X and Y coordinates of an antenna element for a channel n.

10. The method of claim 8, wherein each of the first and second 1-D corrected profiles is calculated by the following equation:

$$\overline{P} = \sqrt{\frac{|\hat{P}_0|}{|\hat{P}|}}\,\hat{P}$$

Where $\hat{P}$ refers to a 1-D profile, $\hat{P}_0$ represents a 1-D FFT main-axis component profile and $\overline{P}$ represents a corrected 1-D profile.

11. The method of claim 8, the method further comprising the step of weighting a weight on the second corrected pixel data, to thereby produce the corrected pixel data.

12. The method of claim 8, wherein the correlation is defined as follows:

$$S_{n,m}=E[I_n\times I_m]+E[Q_n\times Q_m]+j\{E[Q_n\times I_m]-E[I_n\times Q_m]\}$$

Where E represents a mean value; n and m (n ≠m) are correlated channel pairs; $I_n$ and $I_m$ are first signals obtained by the correlated channel pairs; and $Q_n$ and $Q_m$ are second signals obtained by the correlated channel pairs.

13. The method of claim 8, wherein the sub-arrays are arranged in a radial direction about a central position while maintaining a same angular interval therebetween, to thereby form the Y-type configuration.

14. The method of claim 8, wherein an interval d1 between the antenna elements, and interval d2 between the sub-arrays and an interval d3 between the plurality of sub-array groups satisfy a relationship of 0.5λ<d1<λ, 4d1<d2<8d1, 4d1<d3<20d1, wherein λ represents a central wavelength, and wherein a sub-array group includes several numbers of sub-arrays grouped each other.

* * * * *